(12) United States Patent
Ren et al.

(10) Patent No.: US 11,784,267 B2
(45) Date of Patent: Oct. 10, 2023

(54) CIGS LAMINATION STRUCTURE AND PORTABLE SOLAR CHARGER USING SAME

(71) Applicant: SUN HUNTER INC., Albany, NY (US)

(72) Inventors: Yuhang Ren, Secaucus, NY (US); Sihan Jiang, Princeton, NJ (US); Katherine Ren, Secaucus, NJ (US)

(73) Assignee: SUN HUNTER INC., Albany, NY (US)

( * ) Notice: Subject to any disclaimer, the term of this patent is extended or adjusted under 35 U.S.C. 154(b) by 13 days.

(21) Appl. No.: 16/667,557

(22) Filed: Oct. 29, 2019

(65) Prior Publication Data
US 2021/0126145 A1    Apr. 29, 2021

(51) Int. Cl.
*H01L 31/048*    (2014.01)
*H01L 31/0224*   (2006.01)
*H01L 31/0392*   (2006.01)

(52) U.S. Cl.
CPC .. *H01L 31/0481* (2013.01); *H01L 31/022441* (2013.01); *H01L 31/022466* (2013.01); *H01L 31/03928* (2013.01)

(58) Field of Classification Search
CPC .......... H02S 10/40; H02S 30/20; H02S 40/38; H02J 7/35; Y02E 70/30; H01L 31/03928; H01L 31/022466; H01L 31/048
See application file for complete search history.

(56) References Cited

U.S. PATENT DOCUMENTS

| 549,672 A | * | 11/1895 | Jewell | B65H 23/08 |
| | | | | 242/598.3 |
| 4,636,579 A | * | 1/1987 | Hanak | H02S 30/20 |
| | | | | 136/246 |

(Continued)

FOREIGN PATENT DOCUMENTS

| CN | 108428759 | 8/2018 |
| CN | 208939605 | 6/2019 |

(Continued)

OTHER PUBLICATIONS

Olsen, et al., Approaches to encapsulation of flexible CIGS cells, Proc. SPIE 7048, Reliability of Photovoltaic Cells, Modules, Components, and Systems, 70480O (Sep. 10, 2008) (Year: 2008).*

*Primary Examiner* — Sadie White
(74) *Attorney, Agent, or Firm* — Nolte Lackenbach Siegel; Myron Greenspan

(57) ABSTRACT

A flexible laminated solar cell comprising a CIGS photovoltaic layer having two opposing generally flat first and second parallel surfaces; a first encapsulation layer placed on each of said first and second parallel surfaces; an encapsulation vapor barrier film placed on each of said first encaption layers; a second encapsulation layer placed on said encapsulation vapor barrier films; and a third encapsulation layer placed on at least one of said second encapsulation layers. The laminated structure with encapsulation layers protects the CIGS photovoltaic layer against moisture and atmospheric pollutants. The CIGS laminated structure is used in a versatile portable solar charger provided with user interfaces to monitor and control the charger and devices or features contained therein.

17 Claims, 13 Drawing Sheets

(56) References Cited

U.S. PATENT DOCUMENTS

| | | | | |
|---|---|---|---|---|
| 4,648,013 A * | 3/1987 | Curiel | ............. | F21L 4/08 |
| | | | | 362/183 |
| 4,713,492 A * | 12/1987 | Hanak | ............. | H02S 30/20 |
| | | | | 126/624 |
| 5,039,354 A | 8/1991 | Nakagawa | | |
| 5,522,943 A | 6/1996 | Spencer et al. | | |
| 5,605,769 A * | 2/1997 | Toms | ............. | H01L 31/03921 |
| | | | | 136/291 |
| 5,898,932 A | 4/1999 | Zurlo et al. | | |
| 6,380,710 B1 * | 4/2002 | Watanabe | ............. | H01M 10/425 |
| | | | | 257/E27.125 |
| 6,476,311 B1 | 11/2002 | Lee et al. | | |
| D674,746 S | 1/2013 | Zhang et al. | | |
| 9,190,587 B2 | 11/2015 | Lee | | |
| 2002/0041139 A1 * | 4/2002 | Opolka | ............. | H01K 1/26 |
| | | | | 313/316 |
| 2003/0029493 A1 * | 2/2003 | Plessing | ............. | H01L 31/048 |
| | | | | 136/251 |
| 2005/0116143 A1 * | 6/2005 | Watanabe | ............. | H01L 31/03926 |
| | | | | 250/214.1 |
| 2006/0028166 A1 * | 2/2006 | Closset | ............. | H02S 10/40 |
| | | | | 320/101 |
| 2006/0037874 A1 * | 2/2006 | Mitchell | ............. | A47G 11/00 |
| | | | | 206/225 |
| 2007/0295388 A1 * | 12/2007 | Adriani | ............. | H01L 31/0392 |
| | | | | 136/251 |
| 2008/0053516 A1 * | 3/2008 | Hayes | ............. | H01L 31/048 |
| | | | | 136/251 |
| 2009/0147505 A1 * | 6/2009 | Robinett | ............. | H02J 7/35 |
| | | | | 362/183 |
| 2009/0159119 A1 * | 6/2009 | Basol | ............. | H01L 31/022425 |
| | | | | 156/182 |
| 2010/0154860 A1 | 6/2010 | Fereday | | |
| 2011/0036390 A1 * | 2/2011 | Nelson | ............. | B32B 17/10036 |
| | | | | 438/66 |
| 2011/0120532 A1 | 5/2011 | Neugent et al. | | |
| 2011/0162705 A1 * | 7/2011 | Popa | ............. | H01L 31/0749 |
| | | | | 136/256 |
| 2011/0277840 A1 * | 11/2011 | Bryden | ............. | H01L 21/02485 |
| | | | | 136/262 |
| 2012/0118356 A1 * | 5/2012 | Albright | ............. | H01L 31/048 |
| | | | | 136/251 |
| 2012/0125391 A1 * | 5/2012 | Pinarbasi | ............. | H01L 31/0504 |
| | | | | 136/244 |
| 2013/0162193 A1 | 6/2013 | Quick et al. | | |
| 2013/0284234 A1 * | 10/2013 | Funayama | ............. | H01L 31/048 |
| | | | | 136/251 |
| 2013/0285440 A1 * | 10/2013 | Pan | ............. | H01L 31/046 |
| | | | | 307/9.1 |
| 2018/0367084 A1 * | 12/2018 | Wang | ............. | H02S 30/20 |

FOREIGN PATENT DOCUMENTS

| | | |
|---|---|---|
| KR | 20030053988 | 7/2003 |
| WO | 2005074095 | 8/2005 |
| WO | 2017118747 | 7/2017 |

* cited by examiner

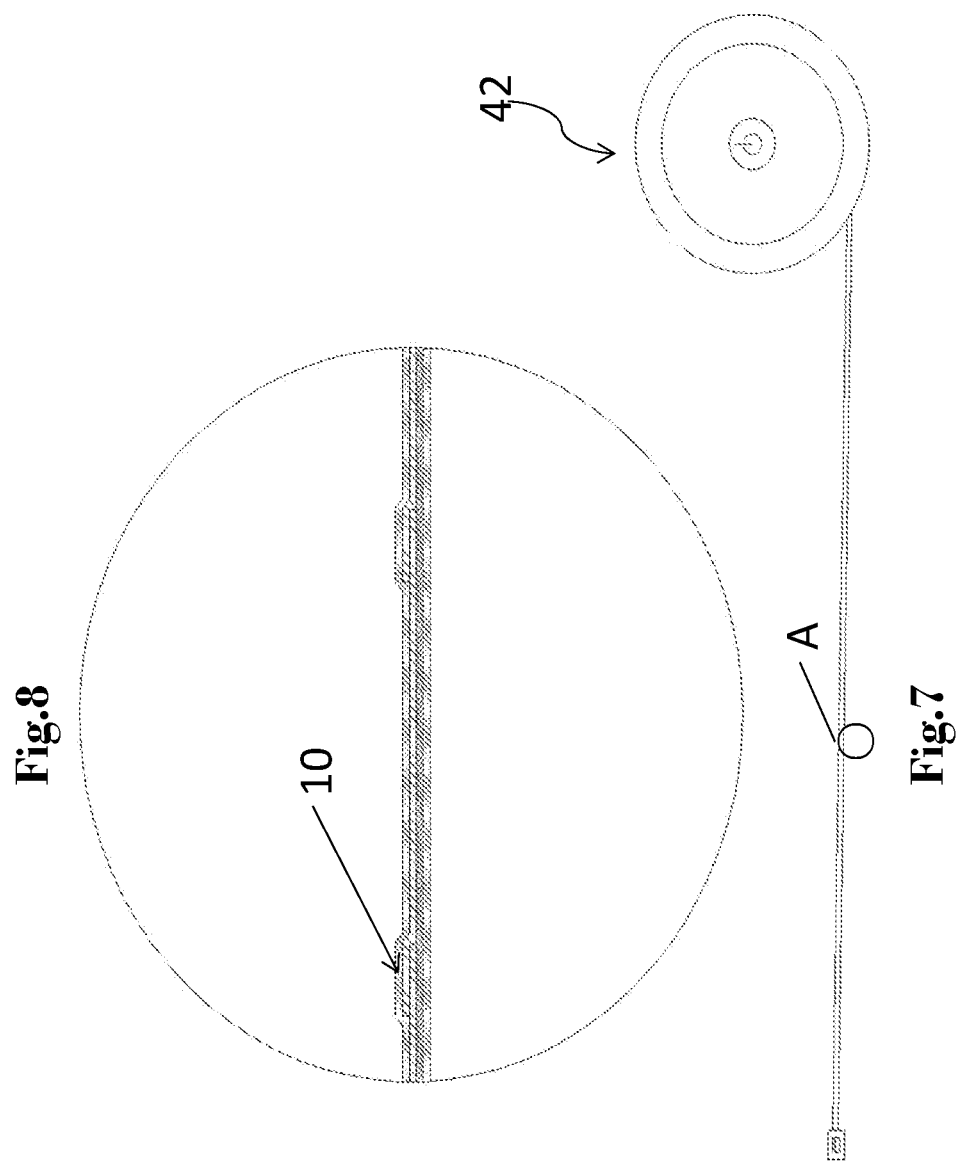

CIGS LAMINATION STRUCTURE AND PORTABLE SOLAR CHARGER USING SAME

BACKGROUND OF THE INVENTION

1. Field of the Invention

The present invention generally relates to improved lamination structures of CIGS solar cells and, more specifically, to CIGS Lamination Structure and portable solar charger using the same.

2. Description of the Background Art

Electronic devices which are widely used today as necessities or commodities in today, such as cellular phones, MP3 players, MD players, notebook computers, portable radios, digital cameras, and camcorders, are supplied with power from storage batteries or dry batteries. However, these batteries have to be recharged or exchanged for new ones after a finite period of time and use. A user needs to have access to a power source or auxiliary power supply to recharge a storage battery. However, this may not be possible if the user is remote from a power source or has no charger.

To solve such problems, portable solar cell electricity chargers have been developed. For example, the U.S. Pat. No. 5,898,932 to Zurlo et al. (FIG. 1), and Korean Patent Publication No. 2003-0053988 (FIG. 2) disclose technologies of attaching directly a solar cell plate to the backside of a storage battery for a cellular phone. However, those approaches have a problem that the solar cell module attached to a cellular phone can be used for only that cellular phone and is not compatible with other portable electric devices.

U.S. Pat. No. 5,522,943 to Spencer et al. (FIG. 3) and U.S. Pat. No. 6,476,311 to Lee et al. (FIG. 4) disclose a solar cell charger built in a separate portable case. However, such a solar cell charger built in a case may not supply enough power for electric devices because the surface area of the solar cell plate to absorb sunlight is relatively small as portable electric devices become smaller and lighter. In addition, the solar cell charger built in a portable case has not presented a concrete technology for automatic voltage regulation to provide an adaptive voltage to diverse electric devices adopting different power voltages or currents, respectively.

In the meantime, a conventional solar cell charger has no means to adjust and position the angle of a solar cell plate to absorb the available light in the most efficient fashion, i.e. aligning the solar cell plate perpendicular to the irradiating line of given light. Moreover, it is very difficult to provide the solar cell electricity charger with appropriate aligning & positioning structure in a mobile environment.

In addition, a charger has to have means for providing bipolar recharging operation, which enables a connecting terminal to freely change its polarities, because electronic devices with fixed polarity connecting terminals are very inconvenient to use in a mobile environment. However, the conventional solar cell charger requires polarity matching for recharging operation.

Portable solar energy supplying devices are known. One such portable solar cell device is disclosed in U.S. Pat. No. 6,476,311.

A portable solar energy supplying device that includes a body, a solar energy board, a secondary battery, a charging circuit, and a control unit. The body has a receiving space. The solar energy board is received in the receiving space, and receives solar energy and converts the solar energy into electrical power when the solar energy board is unfolded outside of the receiving space. The charging circuit is electrically connected with the solar energy board for receiving the electrical power converted by the solar energy board to charge the secondary battery. The control unit is electrically connected to the secondary battery for adjusting the output voltage of the secondary battery for an application system. Thereby, the goals of charging and supplying solar energy are achieved. The occupied space is reduced, it is convenient for the user to carry it, and the solar energy board is protected.

A portable solar cell charger and methods of charging electronic devices using the same include at least one solar cell plate holding a plurality of solar cells; a film with reformed surface formed on the solar cell plate; a power control part supplying a load side with power after perceiving a voltage required from the load side; and a case holding the solar cell plate and the power control part. A method of charging an electronic device using a solar cell charger comprises perceiving a voltage required from a load side using a microprocessor; converting the perceived voltage using D/A converter; comparing the converted voltage with a voltage from a solar cell plate; integrating signals from a comparator and a pulse generator; adjusting the voltage from the solar cell plate; and supplying the voltage from the solar cell plate into the load side.

Another method and device for recharging using a portable multi-voltage solar cell uses at least one solar cell plate holding a plurality of solar cells; a film with reformed surface formed on the solar cell plate; a power control part supplying a load side with power after perceiving a voltage required from the load side; and a case holding the solar cell plate and the power control part. A method of charging an electronic device using a solar cell charger comprises perceiving a voltage required from a load side using a microprocessor; converting the perceived voltage using D/A converter; comparing the converted voltage with a voltage from a solar cell plate; integrating signals from a comparator and a pulse generator; adjusting the voltage from the solar cell plate; and supplying the voltage from the solar cell plate into the load side.

In Chinese Patent CN28939605 a portable solar power bank is disclosed that includes a housing for supporting a rollable solar panel where a stamping grove is formed in the side end of the shell the power bank main body, the shell main body and a clamping block are arranged and the rollable solar panel improve the portability of the device.

A rollable solar module is disclosed in Chinese Patent CN108428759. The module includes a flexible substrate solar cell blocks and an anti-reflective film. A number of solar cell blocks are arranged on the flexible substrate with equidistant gaps being formed between the adjacent solar cell blocks. The solar panel is composed of the solar cell blocks arranged on the flexible substrate so that they can be rolled up for transport.

A rollable solar charger is disclosed in U.S. Design Pat. No. D674,746 that includes a generally cylindrical housing, provided with a longitudinal slit generally parallel to the cylindrical housing through a flexible solar panel can be withdrawn or returned back into the housing. One end cap includes connectors for attaching to external cables and, a voltage selection switch.

SUMMARY OF THE INVENTION

Accordingly, it is an object of the invention to provide a flexible laminated solar cell that can be rolled up when not in use and unrolled and extended to be exposed to solar energy when needed for photovoltaic charging of an external device.

It is another object of the invention to provide a flexible laminated solar cell that is resistant to vapor and can be used in all weather and other atmospheric conditions.

It is still another object of the invention to provide a flexible laminated solar cell as in the previous objects that is simple in construction and economical to manufacture.

It is yet another object of the invention to provide a flexible laminated solar cell that includes a stacking structure that allows photovoltaic cells to be connected in series while avoiding leakage.

It is a further object of the invention to provide a flexible laminated solar cell that includes barriers to vapor and other contaminants while maintaining conversion efficiency.

It is still a further object of the invention to provide a flexible laminated solar cell of the type under discussion that can consist of a plurality of flexible sheets each having spaced first and second parallel edges, associated edges of adjoining sheets overlapping to provide conduction between the sheets and provide electrical continuity therebetween.

It is an additional object of the invention to provide a portable solar charger that includes a flexible laminated sheet as suggested in the previous objects that includes a generally cylindrical core having an axial length substantially equal to the width of the generally longitudinal laminated solar cell to enable the sheet to be rolled up on the core when not used to charge an external device and unrolled from the core to assume a generally flat or planar configuration to expose the CIGS photovoltaic layer to solar radiation to generate electrical energy.

In order to achieve the above objects, as well as others that will become apparent hereinafter, A flexible laminated solar cell comprising a CIGS photovoltaic layer having two opposing generally flat first and second parallel surfaces; a first encapsulation layer placed on each of said first and second parallel surfaces; an encapsulation vapor barrier film placed on each of said first encaption layers; a second encapsulation layer placed on each of said encapsulation vapor barrier films; and a third encapsulation layer placed on at least one of said second encapsulation layers.

A portable solar charger comprising an elongate flexible laminated sheet in accordance with claim 1 having a predetermined width; a generally cylindrical core having an axial length generally equal to said predetermined width to enable said sheet to be rolled up on said core when not used to charge an external device and unrolled from said core to assume a generally flat or planar configuration to expose said CIGS photovoltaic layer to solar radiation to generate electrical energy.

BRIEF DESCRIPTION OF THE DRAWINGS

The above and other aspects, features and advantages of the present invention will be more apparent from the following description when taken in conjunction with the accompanying drawings, in which:

FIG. 7 is a side elevational view of the portable solar charger shown in FIG. 6, with the flexible laminated solar cell in an unrolled or extended position to expose it to solar energy;

FIG. 8 is an enlarged detail A shown in FIG. 7, depicting the manner in which adjacent CIGS battery tablets or cells are superimposed at the transverse edges as shown in FIG. 5;

DETAILED DESCRIPTION OF PREFERRED EMBODIMENTS

Figure 1:
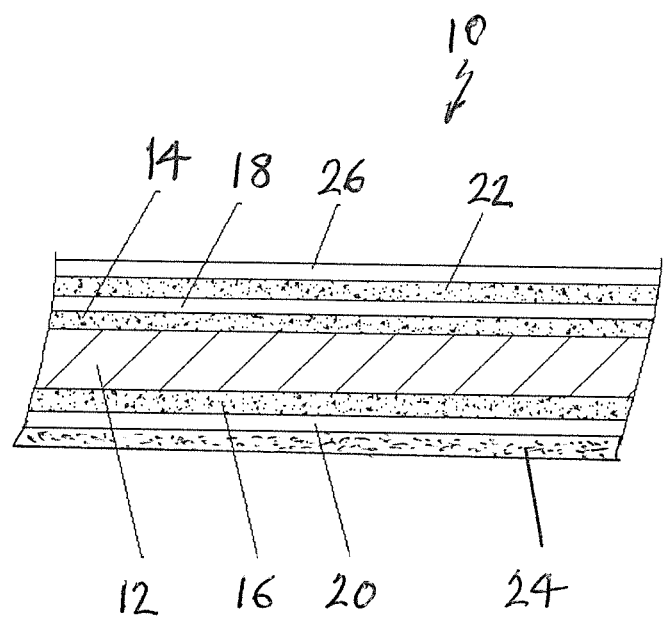
FIG. 1 is a diagrammatic representation of a first encapsulation structure of a flexible laminated solar cell in accordance with the present invention.

Referring now to the figures, in which the identical or similar parts are designated by the same reference numerals throughout, a flexible laminated solar cell is generally identified by the numeral 10.

The flexible photovoltaic laminates sheet is formed of a CIGS photovoltaic layer 12 having two opposing generally flat first and second parallel surfaces as shown. First encapsulation layers 14, 16 are placed on each of the parallel surfaces of the CIGS photovoltaic layer 12. Encapsulation vapor barrier or films 18, 20 are placed on each of the encapsulation layers or films 14, 16. In a first embodiment of the invention, shown on FIG. 1, a third encapsulation layer 26 is placed on the second encapsulation layer 22. The third encapsulation layer 26 is placed on at least one of the second encapsulation layers 22, 24, only one such third encapsulation layer 26 being shown in FIG. 1.

Figure 2:
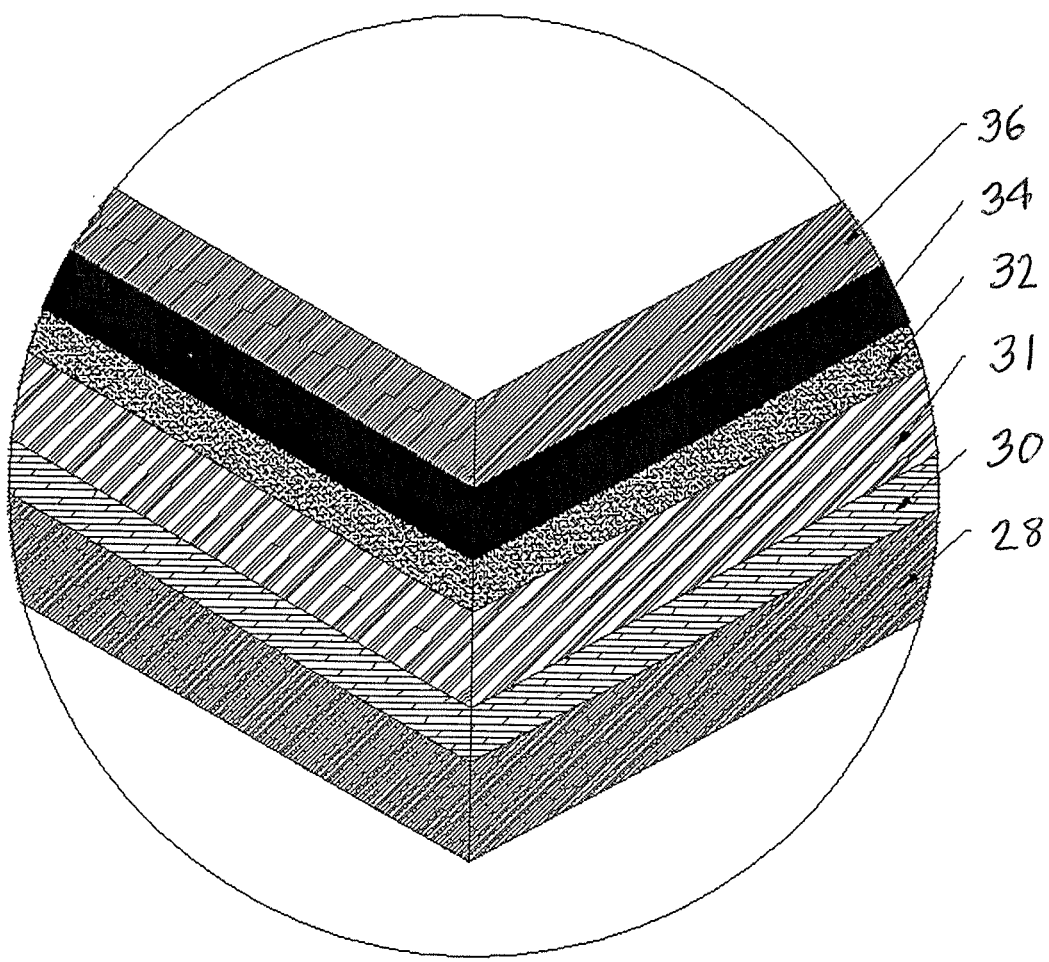
FIG. 2 is diagrammatic representation of a copper indium gallium selenide (CIGS) generator or cell structure utilized in the embodiment shown in FIG. 1.
Figure 3:
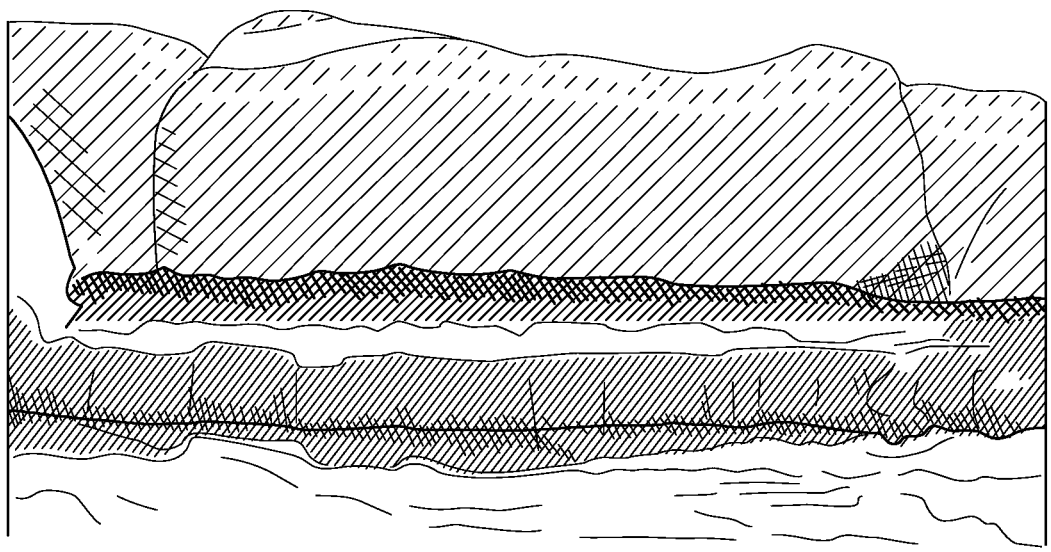
FIG. 3 is a photographic representation of the CIGS structure shown in FIG. 2.

FIGS. 2 and 3 illustrate the details of the CIGS solar cell structure. Substrate 28 may be any suitable or conventional material. In the example shown, the base or substrate 28 is formed as a stainless steel (SS) layer. Placed on the base or substrate is a back electrode 30. In the embodiment being described such back electrode is formed of molybdenum and forms a back contact. A CIGS absorber layer 31 is placed on the back electrode 30 and a buffer layer 32 is placed on the absorber layer 31. In the example, the buffer layer is a layer of caldium sulfide (CdS). Conducting layer 34 is placed on the buffer layer 32 and, in the embodiment shown, a transparent conducting layer (TCO) is a transparent conducting oxide. On the TCO layer there is placed a contact layer 36 which, in the example, is a layer of silver (Ag).

Figure 4:
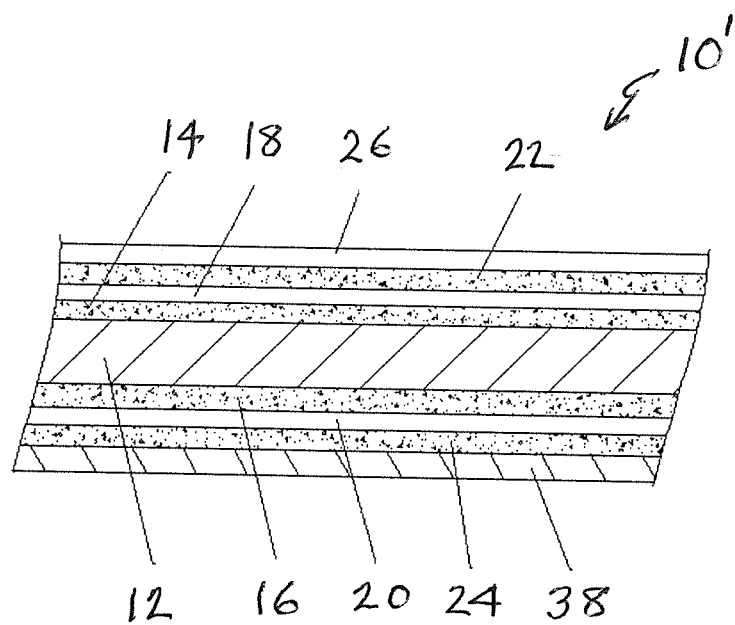
FIG. 4 is similar to FIG. 1 showing an alternate embodiment of an encapsulation structure of a flexible laminated solar cell in accordance with the invention.

Referring to FIG. 4, a second embodiment of an encapsulation structure is similar to the structure shown in FIG. 1 but includes a layer 38 placed on the encapsulation film layer 24. The encapsulation layer 38 is in the form of a vapor proof cloth. Any suitable vapor-proof layer can be used to further encapsulate and protect the CIGS solar cell or photovoltaic layer.

Figure 5:
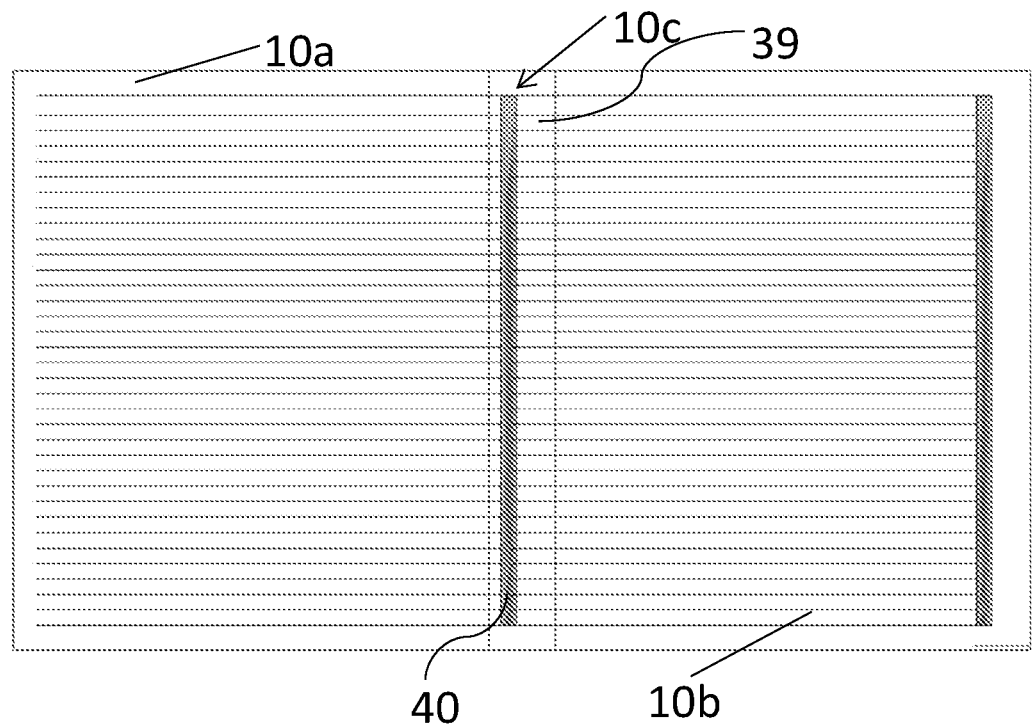
FIG. 5 is a top plan view of a plurality of like flexible laminated sheets joined along their associated or proximate edges producing an overlap region therebetween and a conductive glue or adhesive used to join the two sheets together while maintaining electrical continuity and conductivity between the sheets.

Referring to FIG. 5, the invention contemplates the use of a plurality of like flexible laminated sheets of photovoltaic material as shown. When two like sheets 10a, 10b are arranged so that their substantially parallel edges overlap, the overlapping region 10c is preferably secured so that the adjoining sheets remain electrically and physically connected. Any conductive means may be used for attaching the two adjacent or associated sheets together to provide electrical continuity between the first and second sheets. Multiple sheets may be used to provide or create a longer length of the flexible laminated photovoltaic material, as desired. The conductive material may be, for example, a bar of conductive glue or adhesive 40.

Because the solar cell sheets 10a, 10b are thin, on the order of 1μ, an insulating layer 39 is provided between overlapping edges of the solar cell sheets to avoid current leakage from positive to positive or negative to negative of the solar cells along the edges of each of the solar cells in the overlap region 10c. The insulating layer 39 is provided with an opening substantially along the entire width of the cells as shown for the layer of conductive glue 40 to provide electrical conduction through the conductive glue within the opening.

Figure 6:
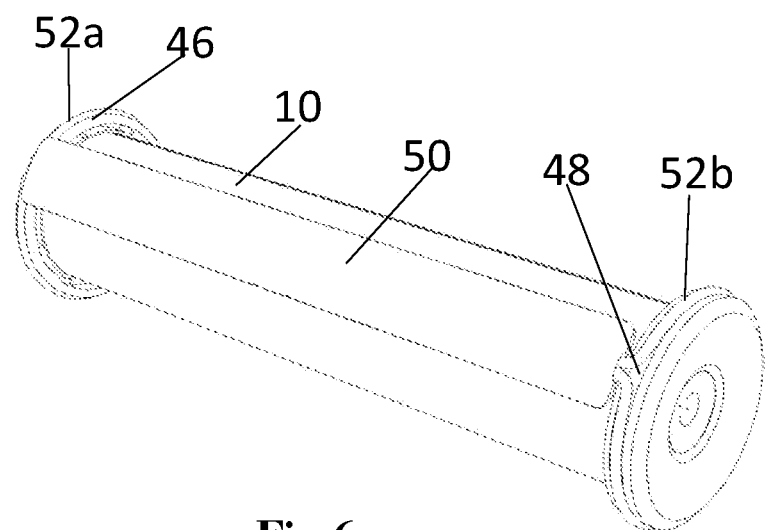
FIG. 6 is a perspective view of a portable solar charger in accordance with the invention utilizing an elongate flexible laminated solar cell of the type shown in FIGS. 1-5 in a rolled up condition when the solar cell is not used to generate electricity from solar energy.
Figure 9:
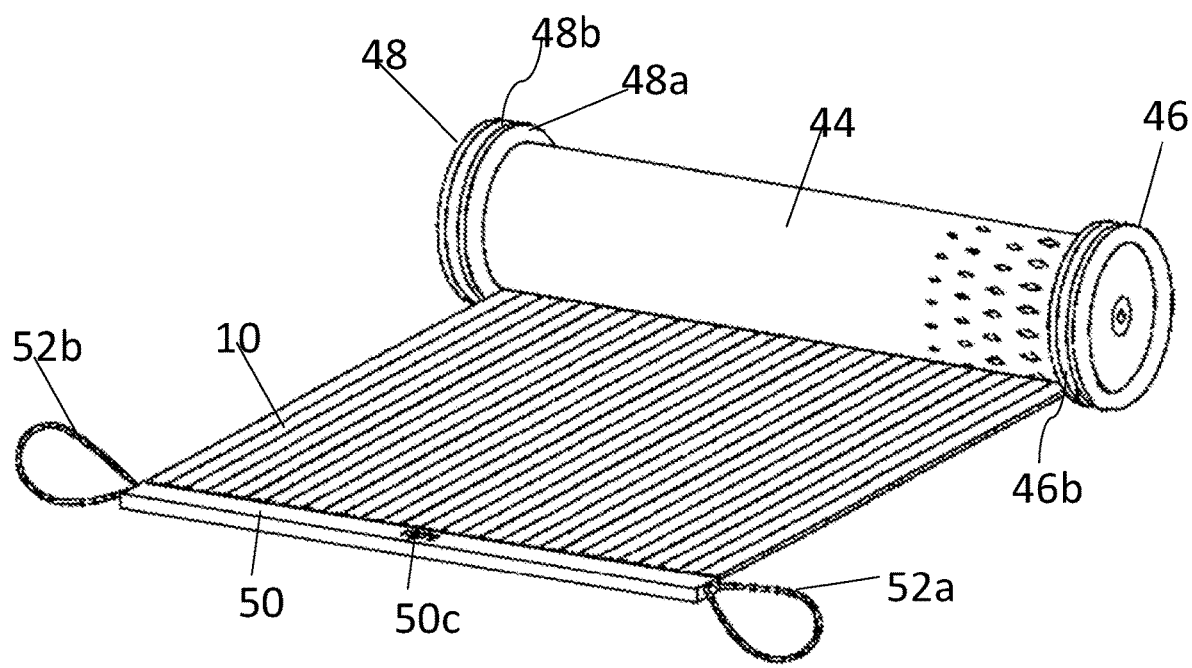
FIG. 9 is a perspective view of the portable solar charger shown in FIGS. 6 and 7 when the flexible laminated solar cell is unrolled from the cylindrical core to expose it to solar energy.
Figure 10:
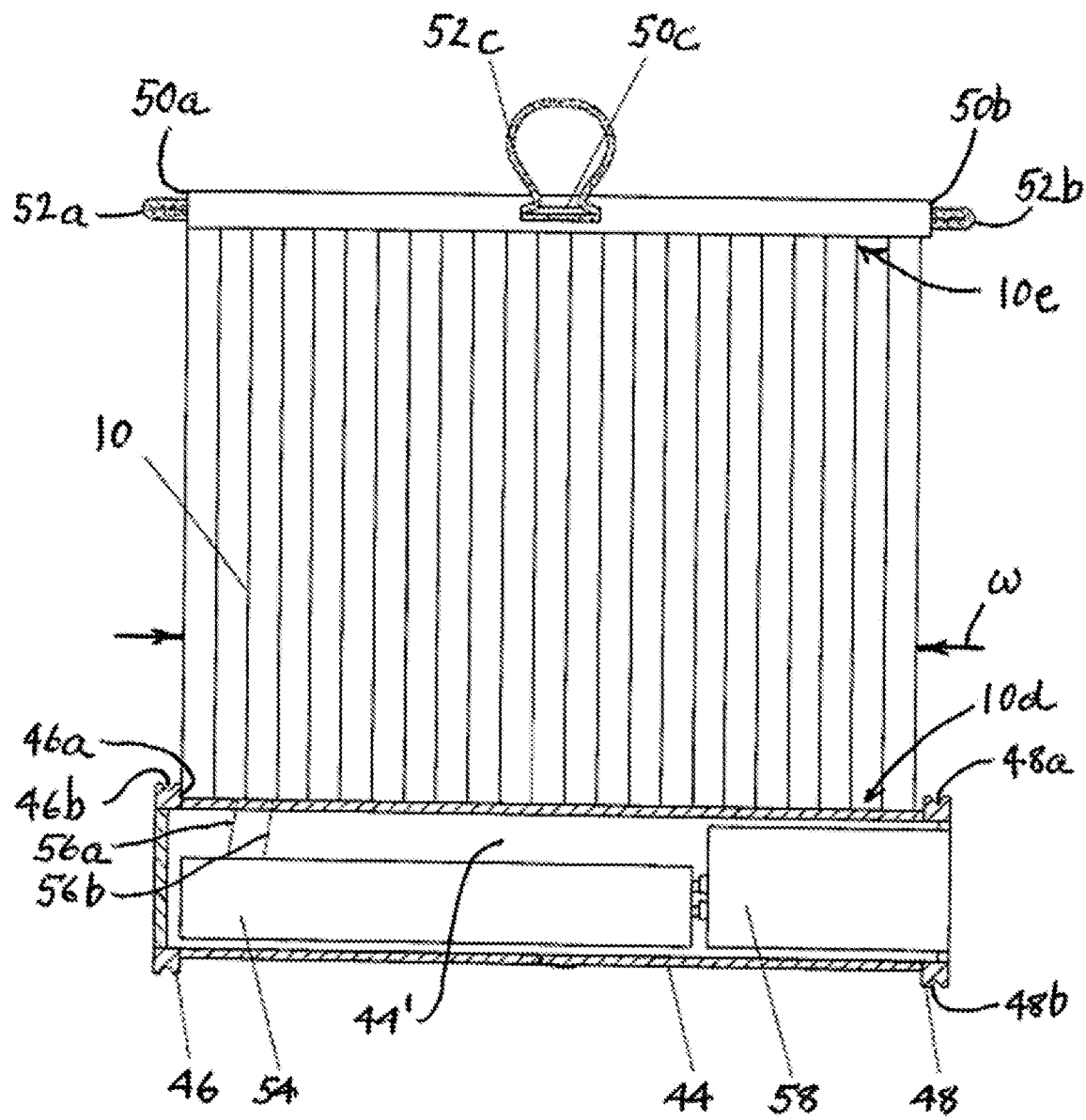
FIG. 10 is a top plan view, partially in cross section, of the portable solar charger shown in FIGS. 7 and 9, also diagrammatically showing a storage cell or battery contained within the cylindrical core and the circuitry for controlling the operation of the charger.

Referring to FIGS. 6 and 7 a portable solar charger 42 is shown that incorporates the flexible laminated solar cell 10. Referring also to FIGS. 9 and 10, the portable solar charger 42 includes a cylindrical core 44 that includes an internal cavity or compartment 44' (FIG. 10). The ends of the cylindrical core 44 are closed by end caps 46, 48 to create a sealed internal cavity or compartment 44' and define internally facing surfaces 46a and 46b that generally correspond to the width "w" (FIG. 10) of the flexible solar cell 10. Core 44 has an axial length generally equal to the width "w" of the solar cell 10 to enable the sheet to be rolled up on the core when not used to charge an external device as shown in FIG. 6, and unrolled from the core to assume a generally flat condition and configuration to expose the CIGS photovoltaic layer to solar radiation to maximize the generation of electrical energy, as shown in FIGS. 7, 9 and 10.

To render the solar charger portable, and to prevent inadvertent unrolling and potential damage to the laminated sheet 10, suitable securing means is provided on the sheet for engaging the end caps 46, 48 when in a rolled up condition to prevent the sheet from inadvertently rolling.

Referring to FIGS. 6, 9 and 10, the end caps are provided with annular circumferential grooves 46b, 48b and the sheet 10 is provided with a loop along each of the longitudinal edges arranged to be received within an associated groove when the sheet is to be maintained in a rolled up condition.

In the embodiment, a rigid tubular member 50 is provided with end openings 50a, 50b and a central slot 50c as best shown in FIGS. 9 and 10. An elastic or other suitable cord extends through the tubular member 50 and is exposed at both ends and accessible in the center of the tube as shown. This creates two elastic loops 52a, 52b and a central loop 52c. The end loops 52a and 52b can be stretched and captured within the grooves 46b, 48b as shown. The loop 52a and 52b maintain the sheet 10 from inadvertently unrolling or unraveling when the portable charger is not in use.

As best shown in FIGS. 9 and 10, the sheet 10 is provided with a proximate edge 10d fixed to the cylindrical core 44 and a remote edge 10e is a free edge that can be moved away from the core when the sheet is unrolled as shown. This forms a means for attaching the remote edge 10e to a vertical surface to suspend the solar charger when unrolled to expose the sheet to solar energy.

Figure 11:
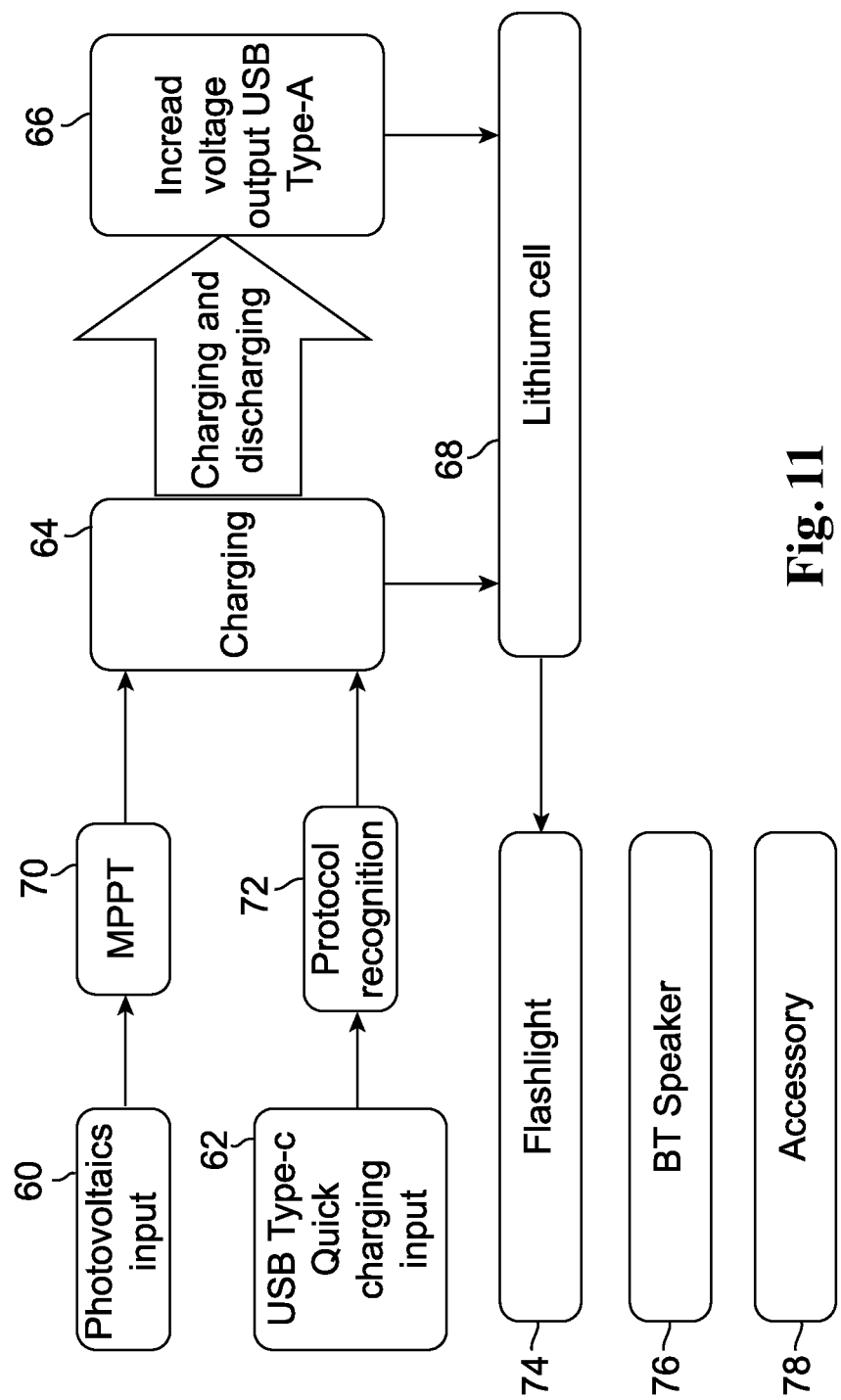
FIG. 11 is a block diagram indicating circuit elements or components within the representative circuitry block in FIG. 10, including circuitry for directing the output of the solar cell and/or direct the output current to an output port or connector for charging an external device and for providing additional functions and features.
Figure 15:
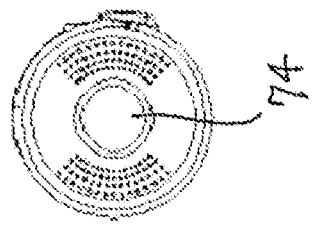
FIG. 15 is a right side elevational view of the solar charger shown in FIGS. 12-14.
Figure 12:
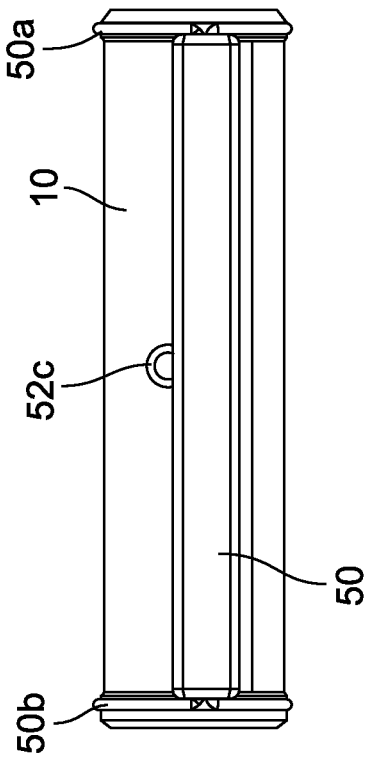
FIG. 12 is a front elevational view of the portable solar charger shown in FIGS. 6, 9 and 10, in a rolled up condition of the flexible solar cell.
Figure 13:
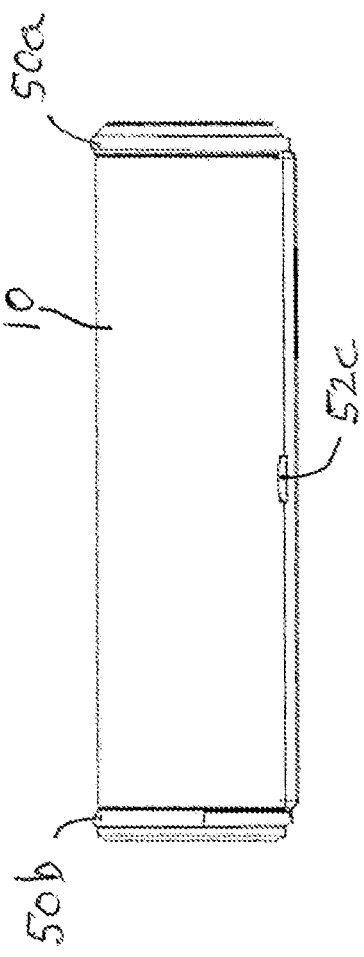
FIG. 13 is a top plan view of the solar charger shown in FIG. 12.

Referring to FIGS. 10 and 11, a battery 54 is housed within the cavity or internal compartment 44' of the cylindrical core 44, the battery being connected to the solar cell 10 by wires or conductors 56a, 56b.

The portable solar charger 52 preferably provided with a functional module or circuitry 58 for controlling and directing photovoltaic current generated by the laminated sheet 10. The output of the solar cell 10 is represented by photovoltaic input 60 to the electrical circuitry. In addition to the photovoltaic input there is advantageously provided a quick charging input 62 that can be in the form of a USB type-C quick charging input port or connector. The currents are generated by the photovoltaic input 60 and/or the quick charging input 62 are regulated by charging control circuit 64 that directs the currents to a voltage output connector or to a storage cell or battery 68. The battery 68 is preferably a lithium cell battery. The output connector 66 may be in the form of a USB type-A port or connector. Provided between the photovoltaic input 60 and the charging control circuitry 64 there is also provided a maximum power point tracking circuit 70 (MPPT). Photovoltaic charging systems frequently use MPPT circuitry to maximize power extraction from solar cells to the loads under all conditions. Controlling the ultimate destination of the solar power the MPPT circuitry maximizes efficiency of the power transfer from the solar cells dependent, for example, on the amount of sunlight falling on the solar cells and the electrical characteristics of the load. As the amount of sunlight varies the load characteristics that give the highest power transfer efficiency changes so that the efficiency of the system is optimized when the loads characters stick changes to keep the power transfer at highest efficiency. The portable solar charger 42, being provided with electrical stored energy, can also be used to power a host of beneficial devices that can be incorporated into the solar charger. Thus, for example, flashlight 74 can be incorporated into one of the end caps.

Figure 16:
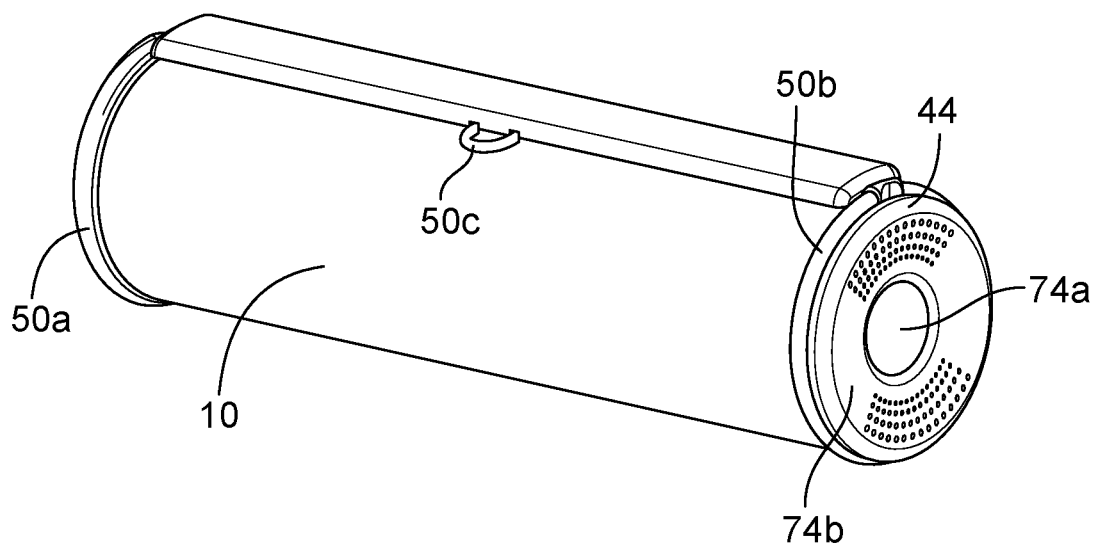
FIG. 16 is a perspective view of the solar charger shown in FIGS. 12-15, showing an additional detail or feature incorporated within the cylindrical core, namely a flashlight and/or a Bluetooth speaker.
Figure 17:
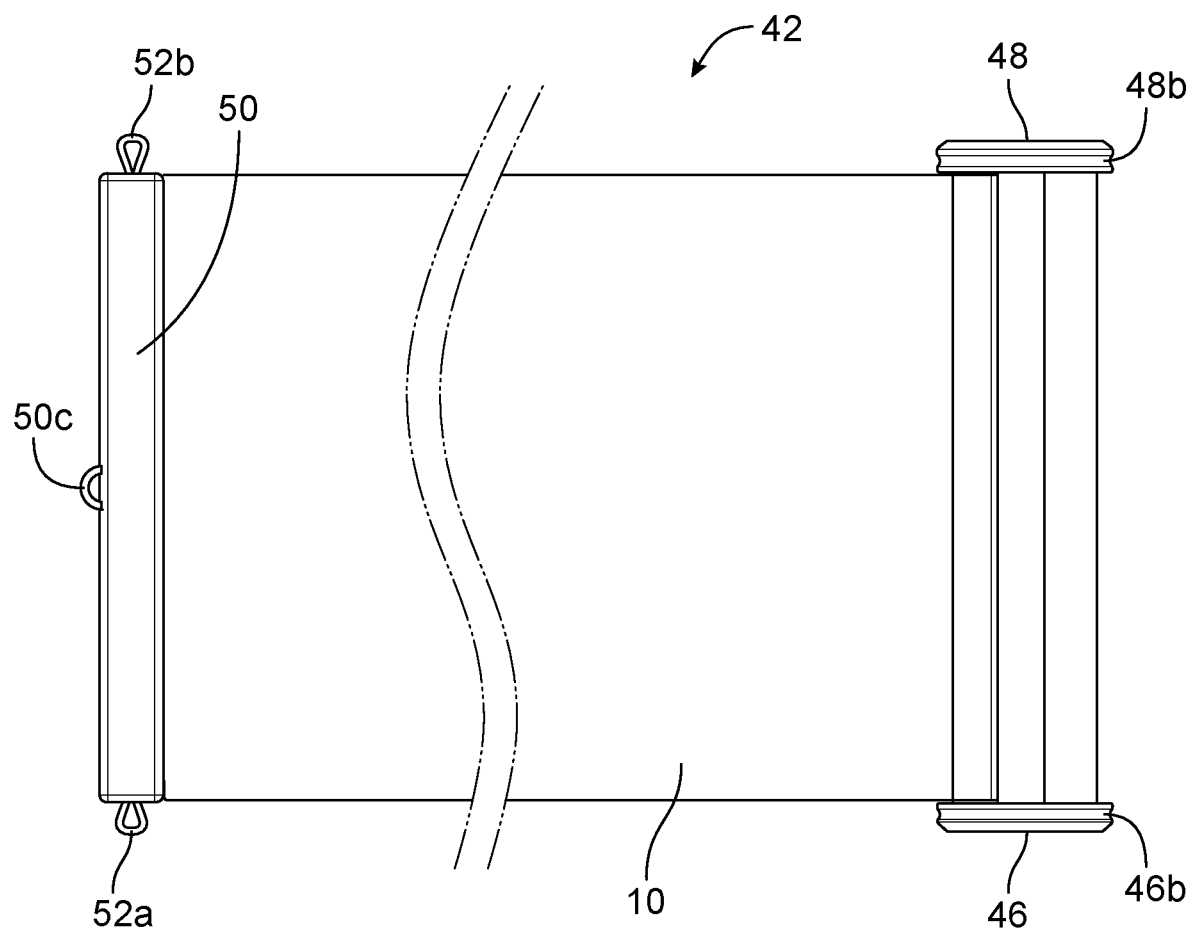
FIG. 17 is a top plan view of the solar charger shown in FIGS. 9, 10 and 12-16.

Referring to FIGS. 16 and 17 the flashlight 74 includes a bulb 74a and reflector 74b directed radially outwardly along the axis of the cylindrical core 44. In fact, any electrically operated accessory 78 (FIG. 11) can be incorporated into the cylindrical core limited only by the size of the accessory and the space available within the cavity 44' as well as the power demands of the accessory.

Advantageously, a protocol recognition circuit 72 is provided (FIG. 11) that recognizes when current is to be drawn from the quick charging input 62.

Figure 14:
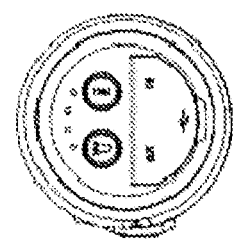
FIG. 14 is a left side elevational view of the charger shown in FIGS. 12 and 13.
Figure 18:
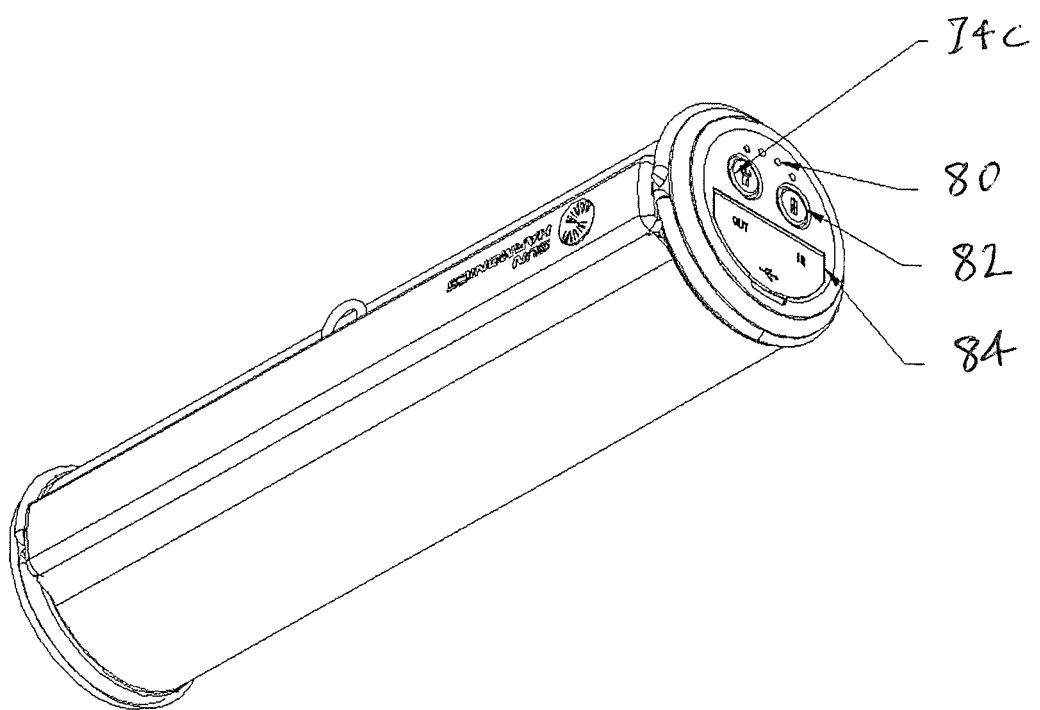
FIG. 18 is a bottom perspective view of the solar charger shown in FIGS. 12-16, showing an enlarged image of the details on one of the end caps shown in FIG. 14.
Figure 19:
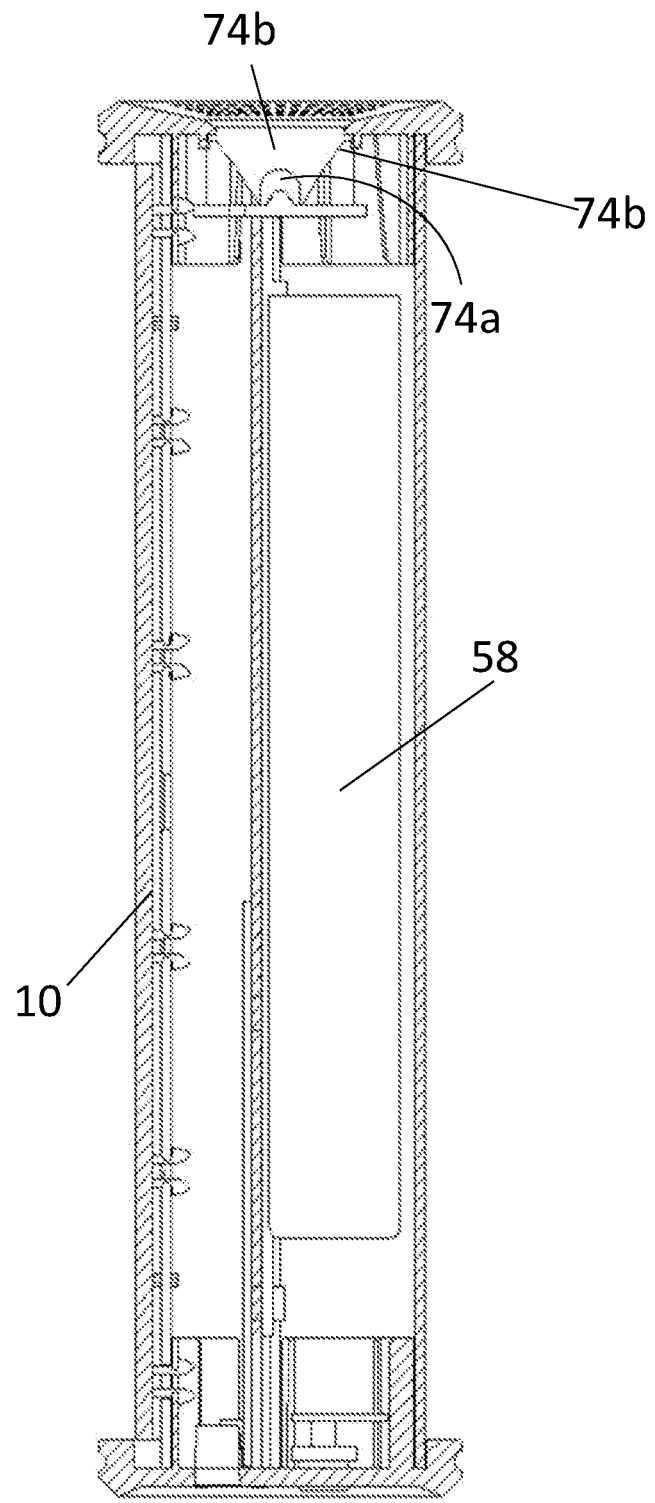
FIG. 19 is a longitudinal cross section of the solar charger shown in FIGS. 12-16.

As best shown in FIGS. 14, 18 and 19, the end caps 46, 48 can also provide interfaces for a user to control the solar charger 42. Protocols and indicators can be provided on one or both of the end caps to facilitate the use of the device, including an on/off switch for the charger, a flashlight on/off button a charge indicator, an input connector for quick charging to supplement or replace photovoltaic current in the absence of solar energy, an output connector suitable for connection to an external device that requires charging and a battery test button. It will be appreciated that the flexible laminated solar cell provides a protective shield that is vaporproof and protects the CIGS photovoltaic layer from moisture and makes it particularly suitable for use in a portable solar charger that incorporates the sheets without compromising the efficiency of solar conversion.

While the invention has been shown and described with reference to certain embodiments thereof, it will be understood by those skilled in the art that various changes in form and detail may be made therein without departing from the spirit and scope of the invention as defined by the appended claims and their equivalents.

What is claimed is:

1. A portable solar charger comprising: an elongate flexible sheet laminated solar cell comprising a continuous CIGS photovoltaic layer having two opposing generally flat first and second parallel surfaces; a first encapsulation layer placed on each of said first and second parallel surfaces, each of said first encapsulation layers being similar single unitary layers; a discrete encapsulation vapor barrier film placed directly on and in contact with each of said first encapsulation layers; a discrete second encapsulation layer placed on each of said encapsulation vapor barrier films; and a discrete third encapsulation layer that comprises a fluoride membrane placed on one of said second encapsulation layers, said flexible sheet laminated solar cell having a predetermined width defined by lateral edges; a generally cylindrical core defining an axis and having an axial length generally equal to said predetermined width to enable said flexible sheet laminated solar cell to be rolled up on said core when not used to charge an external device and unrolled from said core to assume a generally flat or planar configuration to expose said CIGS photovoltaic layer to solar radiation to generate electrical energy, and a rechargeable battery within said core that can be charged by said flexible sheet laminated solar cell when unrolled and exposed to solar radiation and can be used to charge the external device when rolled up on said core, said cylindrical core being provided with end caps positioned beyond said lateral edges, and securing means on said flexible sheet laminated solar cell for directly engaging said end caps in said rolled up condition to prevent said flexible sheet laminated solar cell from inadvertently unrolling, wherein each of said end caps is provided with an annular circumferential groove, and said securing means comprises an elastic stretchable loop along each longitudinal edge arranged to be received within an associated groove when said flexible sheet laminated solar cell is to be maintained in a rolled up condition.

2. A portable solar charger as defined in claim 1, wherein said CIGS photovoltaic layer comprises a substrate layer; an electrode layer placed on said substrate layer; a CIGS absorber layer placed on said electrode layer; a buffer layer placed on said CIGS absorber layer; a transparent conductive layer placed on said buffer layer; and a contact layer placed on said transparent conductive layer.

3. A portable solar charger as defined in claim 2, wherein said electrode layer comprises a layer of molybdenum.

4. A portable solar charger as defined in claim 2, wherein said buffer layer comprises a layer of cadmium sulfide (CdS).

5. A portable solar charger as defined in claim 2, wherein said transparent conductive layer comprises a transparent conducting oxide.

6. A portable solar charger as defined in claim 2, wherein said contact layer comprises a layer of silver (Ag) paste.

7. A portable solar charger as defined in claim 1, further comprising an encapsulation vapor proof layer applied to the other of said second encapsulation layers.

8. A portable solar charger as defined in claim 1, comprising a plurality of flexible sheet laminated solar cells, wherein each flexible sheet laminated solar cell has spaced first and second substantially parallel edges, a first edge of a first flexible sheet laminated solar cell overlapping a second edge of an adjoining second flexible sheet laminated solar cell to form an overlapping region; an insulating layer between said first and second flexible sheet laminated solar cells extending beyond said first and second edges to electrically isolate said first and second flexible sheet laminated solar cells and having an opening within said overlapping region, further comprising conductive means between said first and second flexible sheet laminated solar cells in the region of said opening to provide electrical continuity between said first and second flexible sheet laminated solar cells through said conductive means within said opening in said insulating layer.

9. A portable solar charger as defined in claim 8, further comprising a discrete vapor proof cloth layer covering the other of said second encapsulation layers.

10. A portable solar charger as defined in claim 1, wherein one proximate edge of said flexible sheet laminated solar cell is fixed to said core and a remote edge is a free edge that can be moved away from said core when said flexible sheet laminated solar cell is unrolled.

11. A portable solar charger as defined in claim 10, further comprising attaching means on said remote edge for attaching said remote edge to a vertical surface to suspend said solar charger when unrolled to expose said flexible sheet laminated solar cell to solar energy.

12. A portable solar charger as defined in claim 1, further comprising circuit means for directing photovoltaic current generated by said flexible sheet laminated solar cell to at least one of a charging connector, said battery and a flashlight.

13. A portable solar charger as defined in claim 12, further comprising a maximum power print (MPPT) tracking circuit between said flexible sheet laminated solar cell and said at least one of said charging connector and said cell battery to maximize power extraction from said flexible sheet laminated solar cell under different conditions of load.

14. A portable solar charger as defined in claim 12, further comprising a quick charging input to supplement or replace photovoltaic current in the absence of solar energy or when said flexible sheet laminated solar cell is rolled up.

15. A portable solar charger as defined in claim 12, wherein said circuit means includes a flashlight reflector formed within one of said end caps.

16. A portable solar charger as defined in claim 12, wherein said circuit means includes electrical interfaces for a user including at least one of the following: an on-off switch, a flashlight on-off button, a charge indicator, an input connector for quick charging to supplement or replace photovoltaic current in the absence of solar energy, an output connector suitable for connection to an external device that requires charging and a battery test button.

17. A portable solar charger comprising an elongate flexible sheet laminated solar cell comprising a continuous CIGS photovoltaic layer, said flexible sheet laminated solar cell having a predetermined width defined by lateral edges; a generally cylindrical core defining an axis and having an axial length generally equal to said predetermined width to enable said flexible sheet laminated solar cell to be rolled up on said core when not used to charge an external device and unrolled from said core to assume a generally flat or planar configuration to expose said CIGS photovoltaic layer to solar radiation to generate electrical energy, and a rechargeable battery within sad core that can be charged by said flexible sheet laminated solar cell when unrolled and exposed to solar radiation and can be used to charge the external device when rolled up on said core, said cylindrical core being provided with end caps positioned beyond said lateral edges, wherein each of said end caps is provided with an annular circumferential groove, and said flexible sheet laminated solar cell is provided with an elastic stretchable loop along each longitudinal edge arranged to be received within an associated groove when said flexible sheet laminated solar cell is to be maintained in a rolled up condition.

* * * * *